United States Patent [19]

Franzen

[11] Patent Number: 5,789,041
[45] Date of Patent: Aug. 4, 1998

[54] METHOD FOR PRODUCING FILMS OF UNIFORM THICKNESS BY ION-ASSISTED DEPOSITION

[75] Inventor: Wolfgang Franzen, Harvard, Mass.

[73] Assignee: The United States of America as represented by the Secretary of The Army, Washington, D.C.

[21] Appl. No.: 682,901

[22] Filed: Jun. 17, 1996

[51] Int. Cl.⁶ ................................. C23C 14/24
[52] U.S. Cl. ............. 427/523; 427/566; 427/248.1
[58] Field of Search ..................... 427/523, 524, 427/527, 528, 529, 530, 531, 562, 566, 567, 248.1; 204/192.11

[56] References Cited

U.S. PATENT DOCUMENTS

| | | |
|---|---|---|
| 4,828,870 | 5/1989 | Ando et al. .................... 427/38 |
| 4,992,298 | 2/1991 | Deutchman et al. ............. 427/38 |
| 5,246,741 | 9/1993 | Ouhata et al. .................. 427/524 |

*Primary Examiner*—Shrive P. Beck
*Assistant Examiner*—Timothy Meeks
*Attorney, Agent, or Firm*—Paul S. Clohan; Muzio B. Roberto

[57] ABSTRACT

A method for depositing thin films of improved uniformity on solid objects by the technique of ion-beam assisted deposition. In the ion-beam deposition technique, the surface of a solid substrate is exposed both to a stream of atoms or molecules evaporated from a crucible placed below the substrate and to a beam of ions. The most uniform films are deposited on the substrate when the evaporated particles are emitted in a particular angular direction that depends on the angle of tilt of the substrate. An improved method is disclosed for placing the substrate in a particular angular position relative to the evaporation source. Surface properties such as friction, wear life, surface hardness and resistance to corrosion of many types solid objects can be improved by coating their surfaces with a thin film using this technique.

5 Claims, 7 Drawing Sheets

METHOD FOR PRODUCING FILMS OF UNIFORM THICKNESS BY ION-ASSISTED DEPOSITION

FIELD OF INVENTION

The invention pertains to a method of coating a solid substrate using the ion-beam assisted technique. Surface properties such as friction, wear life, surface hardness and resistance to corrosion of many types solid objects can be improved by coating their surfaces with a thin film using this technique.

BACKGROUND OF THE INVENTION

In order to deposit a thin film on a substrate by physical vapor evaporation combined with ion-beam bombardment, a stream of evaporated particles and an ion beam arrive at the surface of the substrate from different directions, an arrangement common in ion-beam assisted deposition. The substrate is frequently tilted in order to allow the ion beam and a stream of evaporated particles to intersect. The dynamics of film growth under these conditions have been studied extensively in the past with emphasis on the physical processes that affect film growth, such as sputtering, back scattering, gas desorption, etc. As a result, the thickness of the evaporated film will vary over the surface of the substrate, an undesirable result, since uniformity of thickness is important in many application. The prior art does not emphasize certain geometrical factors that are important to film formation on a tilted substrate.

Referring to the geometrical configuration in FIG. 1, a nearly parallel ion beam moving in a horizontal direction impinges on the left side of a substrate S, which is tilted with respect to a line perpendicular to the surface of an evaporant, while a divergent beam of evaporated particles (e.g. atoms or molecules) emitted by a small source E placed under the substrate strikes it from below. Since a nearly parallel beam of ions and a divergent beam of atoms or molecules intersect on the surface of the substrate S, the deposited film will not be uniform for purely geometrical reasons, quite apart from the other physical processes mentioned above. Both the thickness of the film and its composition will vary from point to point over the surface because of three geometrical factors: (1) the inverse square law; (2) the emission angle from the source; and (3) the angle of incidence of the evaporated particles (e.g. atoms or molecules)on the surface of the substrate. Since uniformity of thickness and composition are important in many applications, an examination of the influence of these factors together with a derivation of the corresponding equal thickness contours are of interest. The usual arrangement of a tilted substrate placed directly above the source is not the optimum configuration from this point of view, as will be demonstrated, both analytically and by experiment.

SUMMARY OF THE INVENTION

The present invention discloses an improved method of depositing a film on a solid substrate by physical vapor evaporation combined with ion-beam bombardment.

The present invention discloses an improved method of tilting the substrate at certain angles with respect to both a stream of evaporated particles and an ion beam.

The invention proposes a method for depositing thin film of improved uniformity on solid objects by ion-beam assisted deposition.

DETAILED DESCRIPTION OF THE PREFERRED EMBODIMENTS

Figure 1:
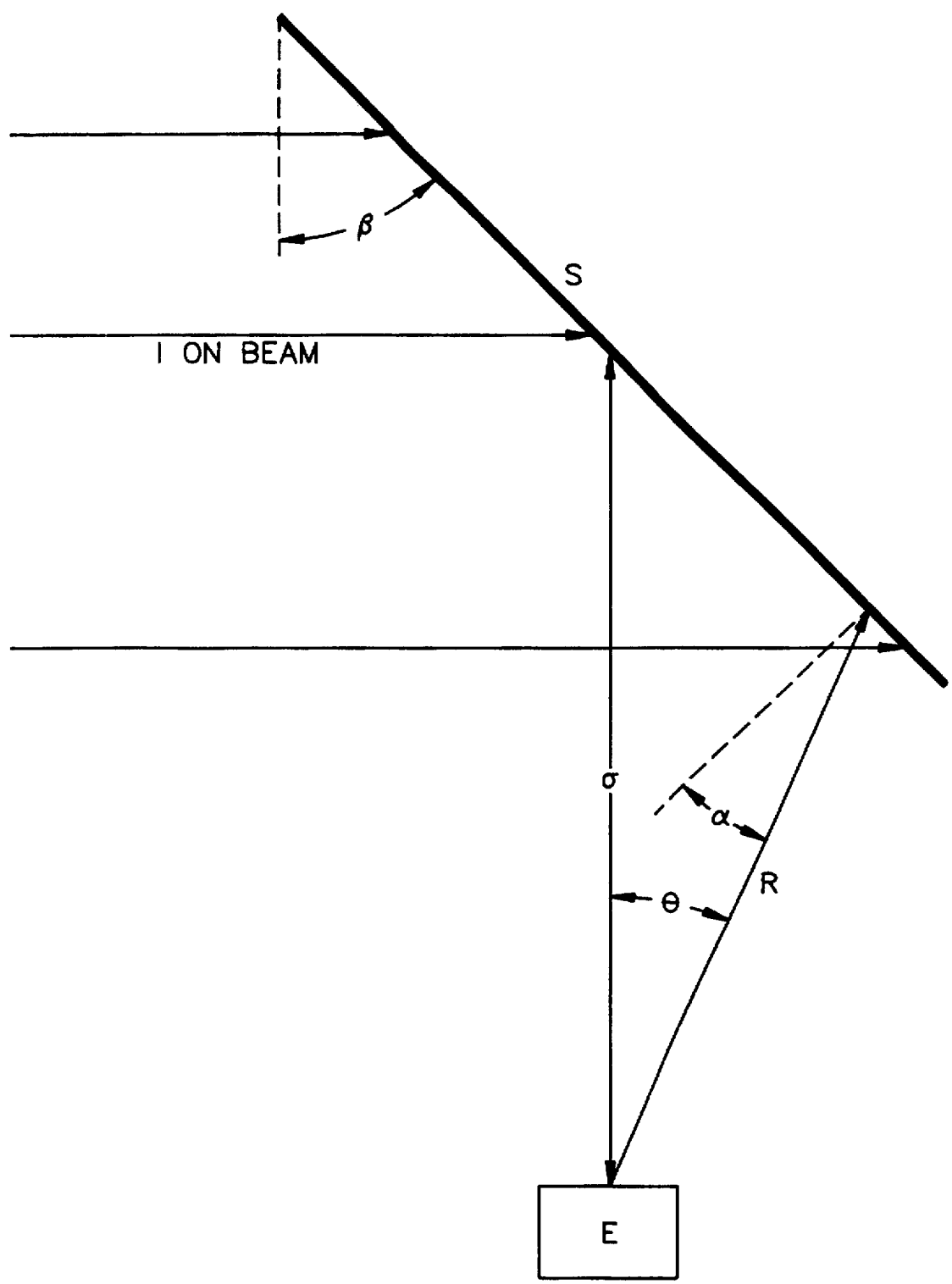
FIG. 1 illustrates the geometry of ion-assisted deposition. S is a substrate and E is an evaporation source. $\Theta$ is an emission angle for a particle path of length R; $\alpha$ is an angle of incidence on the substrate; $\sigma$ is the vertical distance between E and S; $\beta$ is the tilt angle of the substrate.

As shown in FIG. 1, evaporation from source E is equivalent to effusion of a gas through a small aperture into a vacuum. The number per second of particles (atoms or molecules) that pass through an aperture of area A and strike unit area of a substrate S located at a distance R from the source E of evaporated atoms is given by the following expression:

$$q = \left( \frac{nA\bar{v}}{4\pi R^2} \right) \cos\theta\cos\alpha \qquad (1)$$

where n is the number density of particles behind the aperture, v their average velocity, $\theta$ is the emission angle (i.e., the angle between the particle path and a normal to the surface of the aperture), and $\alpha$ is the angle of incidence of the particle on the substrate. For a sticking probability of less than unity, q would be reduced by a constant factor if the possible dependence of this probability on the angle of incidence is neglected. In any case, the deposit thickness is proportional to the following parameter:

$$k = \frac{\cos\theta\cos\alpha}{R^2} \qquad (2)$$

whose value varies over the surface of the substrate. Contours of constant density correspond to constant values of k. The object is to derive an equation that describes the shape of the constant density contours.

Beam and Substrate Geometry

Figure 2:
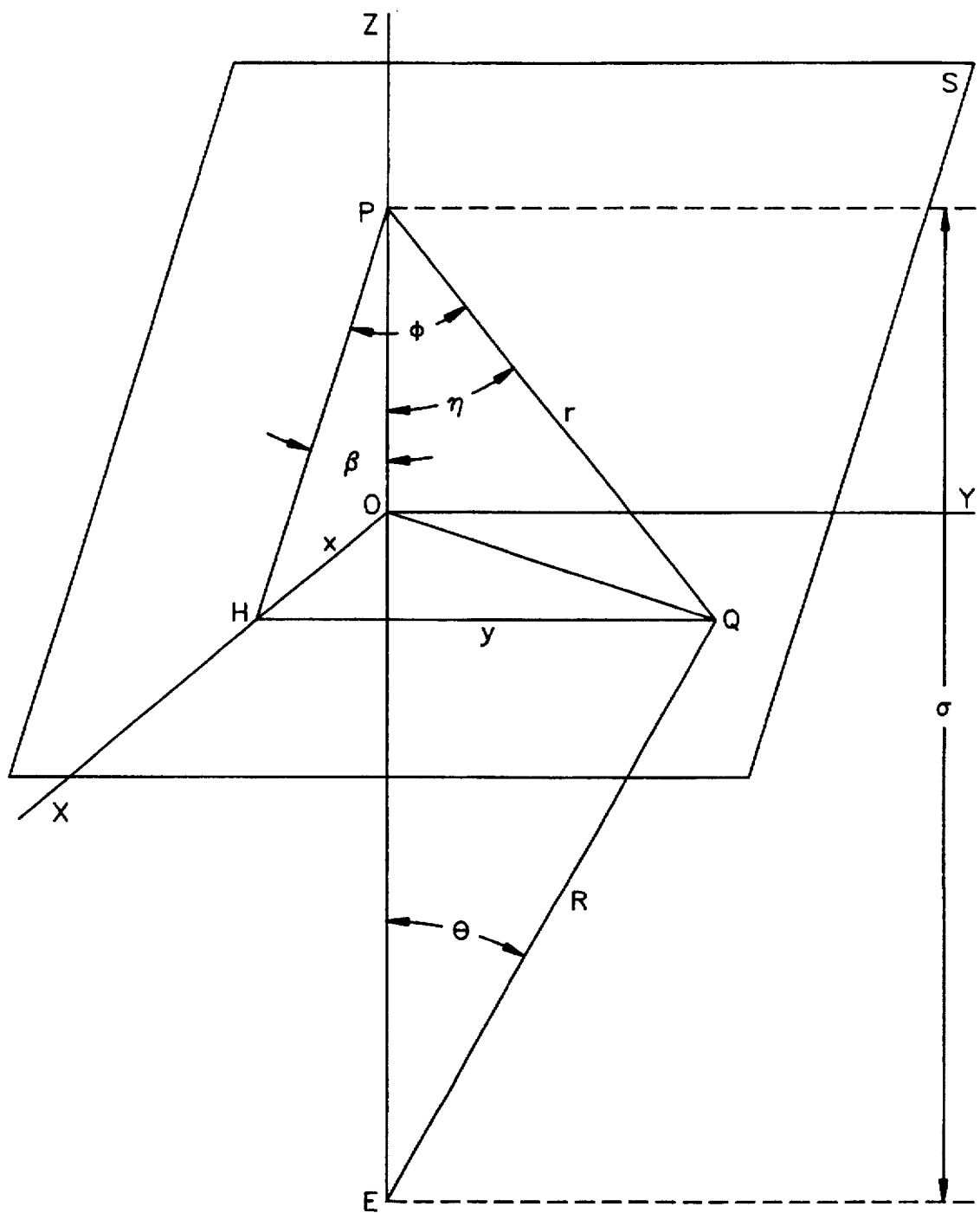
FIG. 2 illustrates the geometrical relationship between the tilted substrate S and the evaporation source E. A particle (atom or molecule) evaporated from E strikes S at Q. The vertical (x,z) plane is perpendicular to the substrate and intersects it along the line PH.

Consider the diagram shown in FIG. 2. E is the evaporation source and S the substrate which is tilted at an angle $\beta$ relative to the vertical Z-axis. The Z-axis passes through evaporation source E and intersects substrate S at the point P, a distance $\sigma$ from source E. Now assume that an evaporated particle strikes substrate S at the point Q, at an angle of incidence $\alpha$. Its path makes an angle $\theta$ with the Z-axis. We can define the position of Q either in terms of the Cartesian coordinates (x,y) in a horizontal plane that passes through Q and intersects the Z-axis at O, or in terms of polar coordinates $(r,\phi)$ on the tilted plane (the surface of the substrate) with origin at P. The following geometrical relations will then apply:

$$x = r \cos \eta \tan \beta \quad (3)$$

$$r \sin \eta = R \sin \theta \quad (4)$$

$$\cos \theta = \frac{\sigma - r\cos\eta}{R} \quad (5)$$

$$\cos \alpha = (\hat{n} \cdot \vec{R}/R) = (\hat{x}/R) \cos \beta + \cos \theta \sin \beta \quad (6)$$

$$R^2 = \sigma^2 + r^2 - 2\sigma r \cos \eta \quad (7)$$

$$\cos \eta = \cos \phi \cos \beta \quad (8)$$

Here $\hat{n} = \hat{x} \cos \beta + \hat{z} \sin \beta$ is a unit vector normal to the tilted plane and $\hat{x}$ and $\hat{z}$ are unit vectors along the positive x and z axes, respectively. From equations (3), (4) and (6) it follows that the cosine of the angle of incidence $\alpha$ is given by:

$$\cos \alpha = \sin \beta (\sin \theta \cot \eta + \cos \theta) \quad (9)$$

By combining this expression with equations (5), (7) and (8), the parameter k given by equation (2) will then assume the form:

$$k = \frac{\sin\beta}{\sigma^2} \left\{ \frac{1 - (r/\sigma)\cos\phi\cos\beta}{[1 + (r/\sigma)^2 - 2(r/\sigma)\cos\phi\cos\beta]^2} \right\} \quad (10)$$

For a given constant value of k, equation (10) can be regarded as an implicit equation in the polar coordinates (r,φ) [defined on the inclined substrate] of curves that represent equal thickness contours. Concentric contours for β=45° have been plotted by computer in FIG. 3 for different values of the dimensionless parameter $K = (2)^{1/2} \sigma^2 k$. Three-dimensional contours for three different values of the tilt angle β are shown in FIG. 4.

Evidently the contours have the appearance of distorted ellipses symmetrical about the (x,z) plane, as we would expect. The largest value of k (i.e. the thickest deposit) is located on the intersection of the (x,z) plane with the substrate, in other words, on the line φ=0. Under these conditions, $$k = \frac{\cos\theta \sin^3(\beta + \theta)}{\sigma^2 \sin^2\beta} \quad (11)$$

This quantity attains its largest value for the emission angle $\theta_M$ given by $$\theta_M = \arctan[\sqrt{(4\tan^2\beta + 3)} - 2\tan\beta] \quad (12)$$

Figure 5:
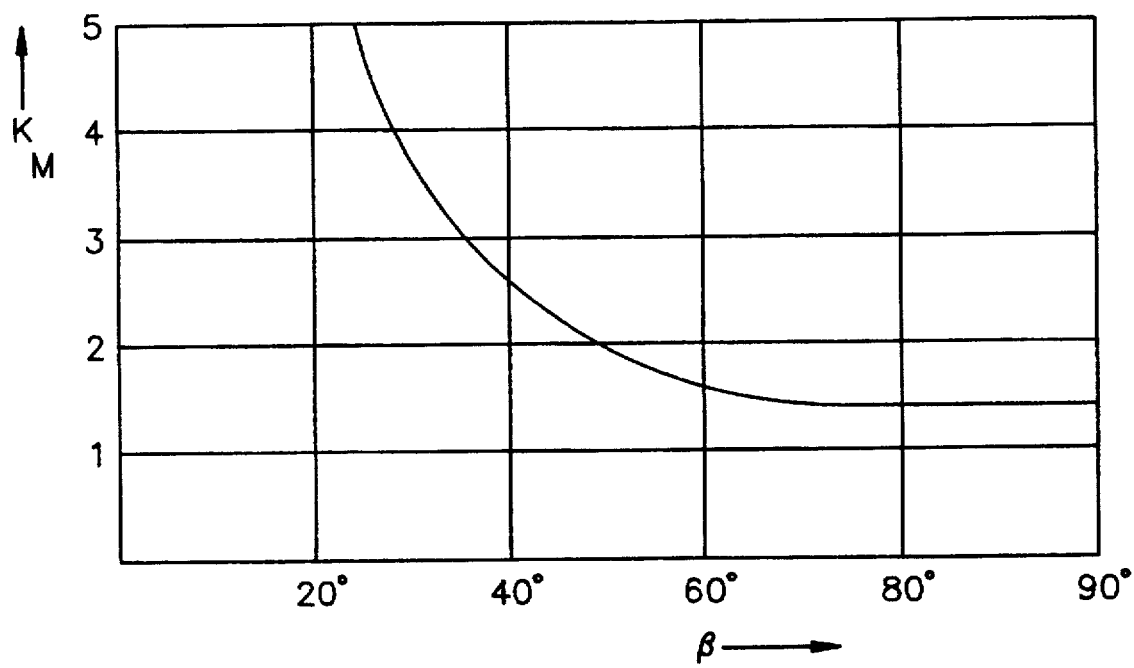
FIG. 5 is a plot of the variation of the maximum value $K_M$ of the parameter K as a function of the tilt angle $\beta$.
Figure 6:
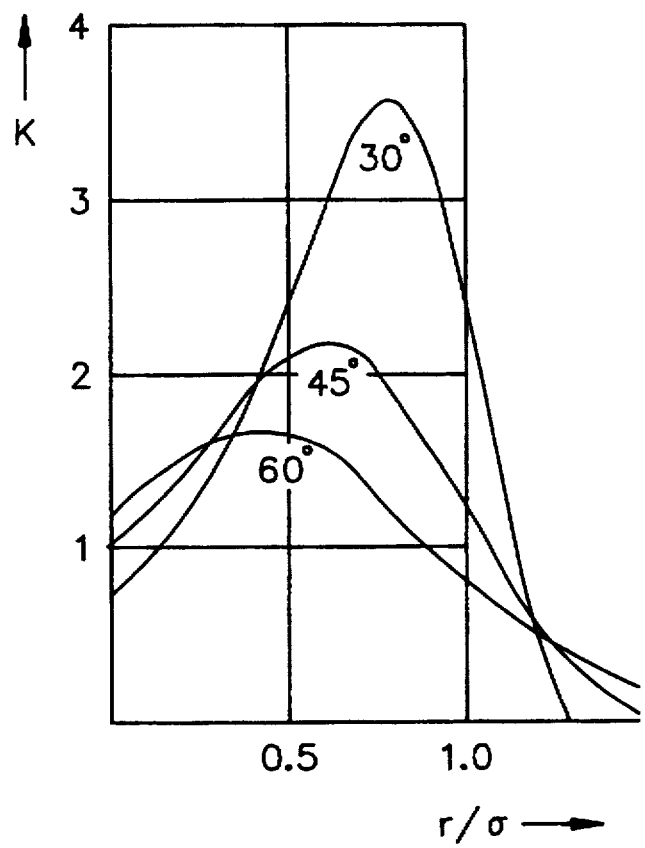
FIG. 6 is a plot of the thickness parameter K as a function of the relative displacement $r/\sigma$ along the line $\phi=0$ for $\beta=30°$, 45° and 60°.

A plot of the maximum value $K_M$ of the thickness parameter K vs. β is shown in FIG. 5. FIG. 6 illustrates the dependence of K on the relative displacement r/σ along the line φ=0, i.e. along the line PH of FIG. 2.

Figure 3:
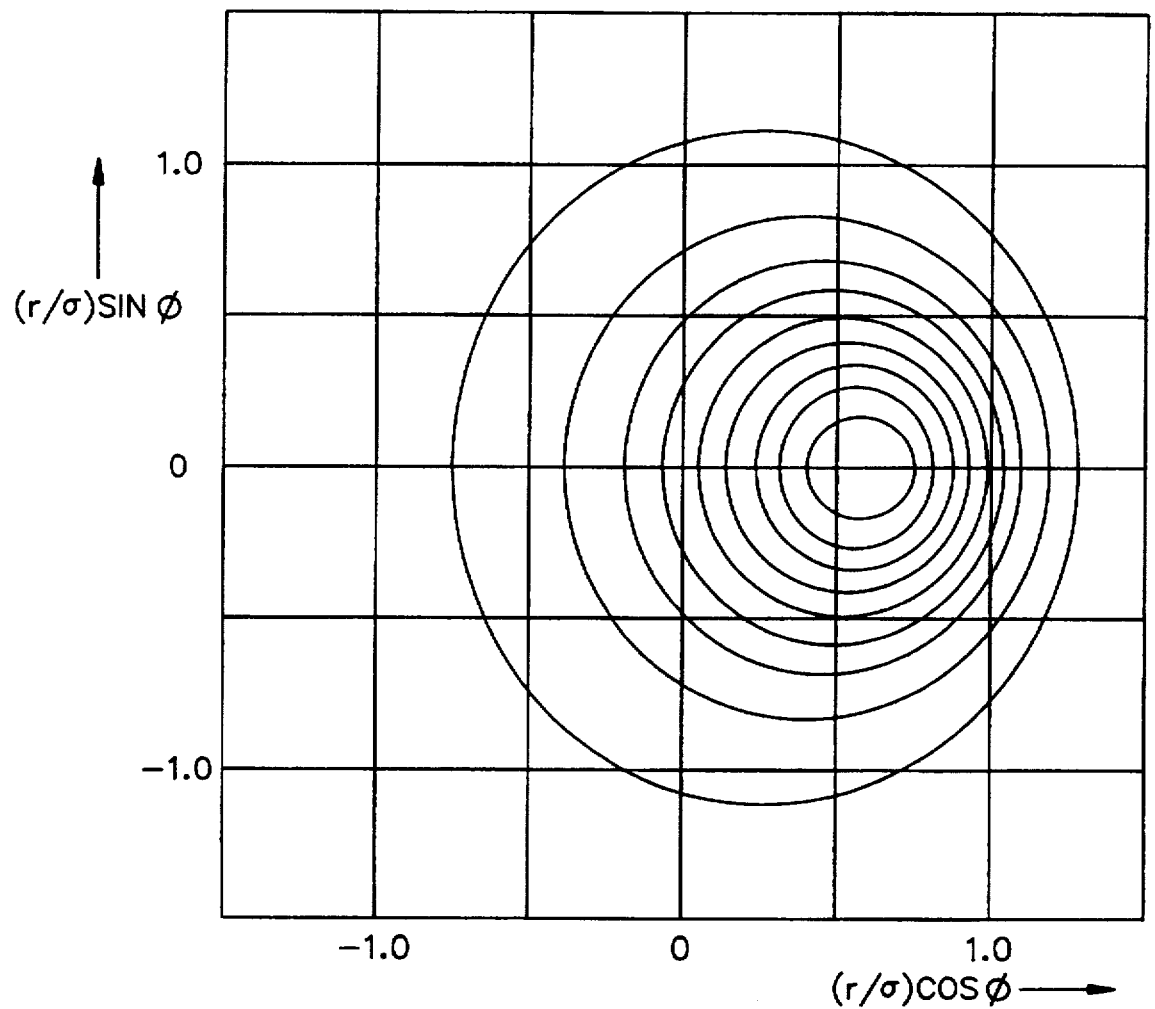
FIG. 3 is a plot of equal thickness contours for a tilt angle $\beta=45°$. K values of successive contours differ by 0.2.
Figure 4:
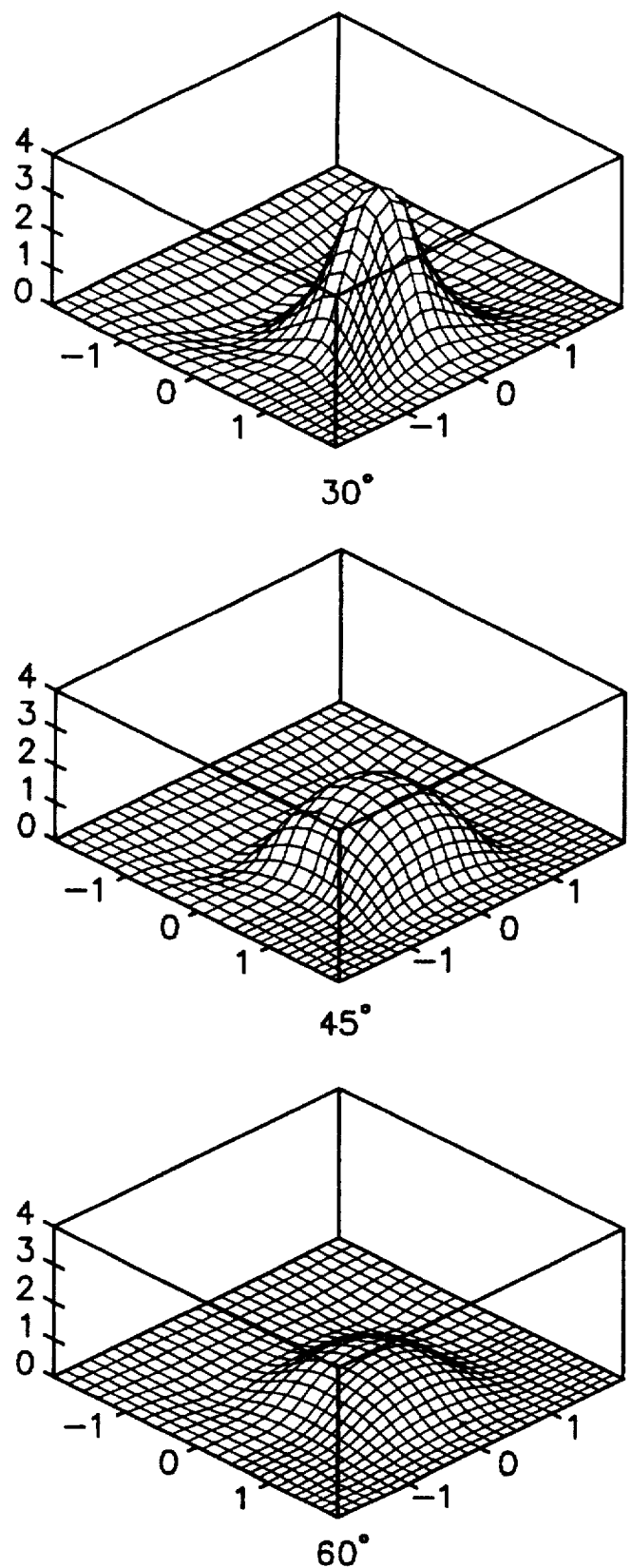
FIG. 4 shows three-dimensional equal-thickness contours for three different tiltangles $\beta$. The vertical axis is the parameter K, and the horizontal axes are $(r/\sigma) \cos\theta$ and $(r/\sigma) \sin\theta$, respectively.

For a tilt angle of 45°, a commonly used value, the evaporated deposit is thickest as well as most uniform at an emission angle of θ=32.85°, a site that correspond to the center of the smallest closed contour for β=45° shown in FIG. 3. Uniform deposition over a larger region would require an evaporation source with a larger aperture as, for example, in the case of electron beam evaporation of a refractory substance by periodic scanning of the electron beam over the surface of the source material. However, the geometrical criteria that we have applied would still hold whenever the substrate is not parallel to the plane of the aperture. Equal thickness contours similar to the ones derived here could then be computed by integrating equation (1) over the surface of the aperture.

Experimental Test

Incidental to an investigation of the tribological and related properties of ion-beam-bombard evaporated siloxane films, an experimental test was carried out of the predictions of the analysis just presented. A 12.5 cm diameter flat circular silicon wafer was coated with evaporated Dow Coming type 704 oil (tetraphenyl-tetramethyl-trisiloxane) and bombarded during deposition with 40 kV $Ar^+$ ions. The source-substrate geometry corresponds to the arrangement shown in FIG. 1, with β=45° and σ=18 cm. In order to maintain a constant substrate temperature during bombardment, the wafers were mounted on a water-cooled sample stage. Furthermore, they were cleaned prior to bombardment for ten minutes with the same $Ar^+$ beam. The source consisted of a copper bottle filled with oil, heated electrically from below and closed off with a 0.203 cm thick copper disk provided with a 0.25 cm diameter hole. During evaporation, the oil temperature, as monitored by a thermocouple attached to the bottle, was maintained constant at a value of 135° (corresponding to a vapor pressure of $5.2 \times 10^{-3}$, approximately). The usual pressure of $2 \times 10^{-6}$ torr in the vacuum chamber of the Zymet ion implanter used in the experiment rose to $3 \times 10^{-5}$ torr during the deposition, which was controlled by a shutter placed above the evaporation aperture. The $Ar^+$ ion beam had a maximum current density of 101 μA/cm² and consisted of a ribbon 2 cm wide and 20 cm high scanned horizontally across the substrate at a frequency of 1 Hz.

Figure 7:
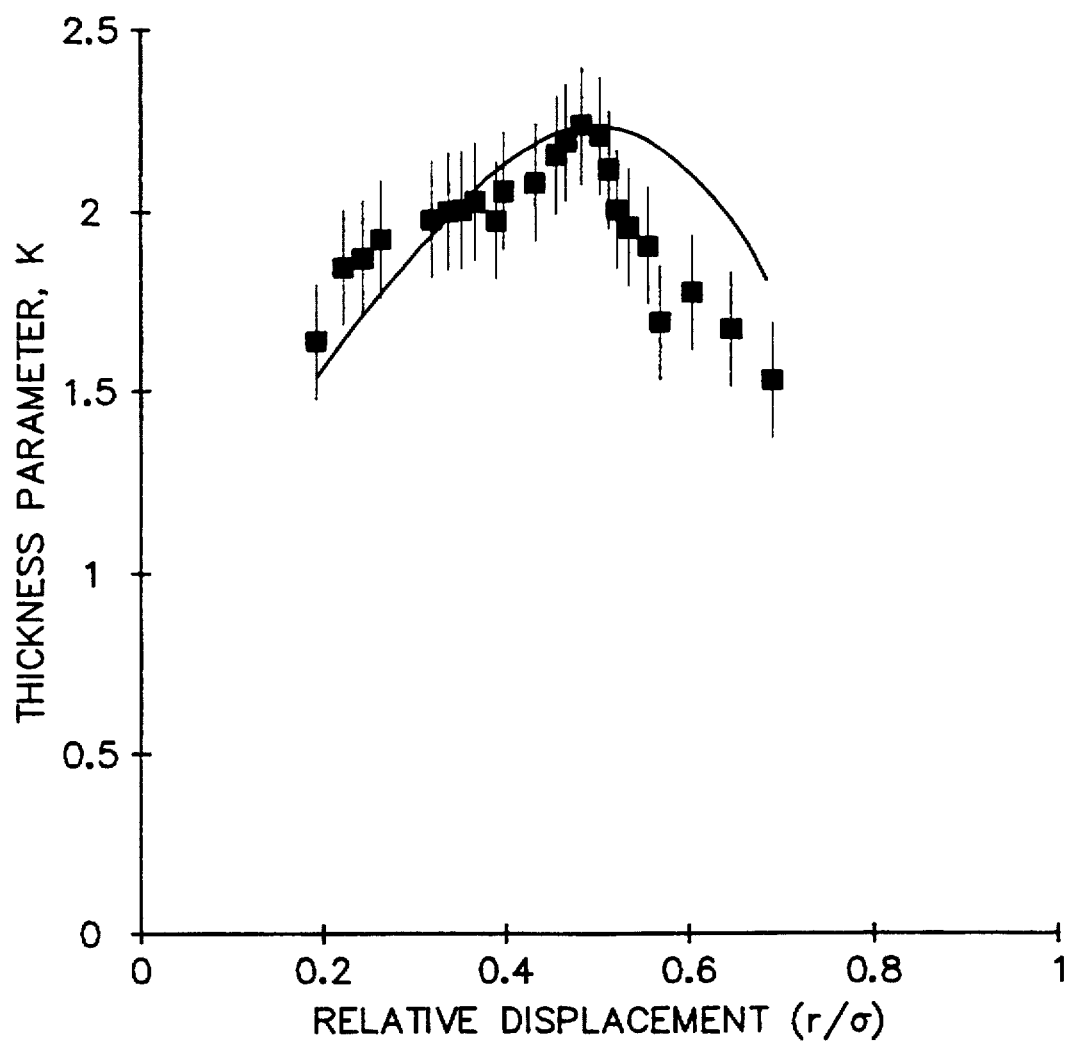
FIG. 7 is a comparison for a tilt angle ($\beta=45°$ of the predicted dependence of K on $r/\sigma$ along the line $\phi=0$ (solid curve) with experimental data obtained by RBS (vertical bars).

The ion bombardment causes the evaporated siloxane oil film to decompose and form a hard adherent coating with a low friction coefficient. The thickness of the film formed on the silicone substrate was determined by Rutherford backscattering (RBS) of 2 MeV $He^+$ ions produced by a NEC tandem accelerator. The energy of ions backscattered from a series of small areas on the coated silicon disk located along the lines φ=0 was determined. A measure of film thickness could be obtained by simulating the RBS spectrum with the standard program RUMP. The results of these measurement, superimposed on the predicted thickness variation (the 45° curve of FIG. 6), are shown in the FIG. 7 and appear to be in approximate agreement with the invention presented above.

Three factors, namely the inverse square law, the angular distribution of evaporated particles, and a varying angle of incidence, combine to produce distinctive thickness contours that resemble distorted ellipses on a tilted substrate exposed to particle emitted by a small source placed below the substrate. The most uniform deposits are formed at the centers of the contours whose location depends on the angle of tilt.

What is claimed is:

1. A method of depositing a thin film of uniform thickness on a solid substrate having a surface, comprising the steps of:

(a) placing a first source of particles below said surface of said substrate;

(b) tilting said substrate at an angle of tilt:

(c) exposing said surface of said solid substrate to said first source of particles;

(d) placing particles from said first source of particles in a first stream of particles evaporated from said first source;

(e) exposing said surface of said tilted substrate to a second stream of particles from a second source of particles such that said first stream of particles and said second stream of particles intersect perpendicularly at said surface of said substrate;

(f) placing said first source of particles below said surface of said substrate to achieve an angle of emission of said first stream of particles leaving said first source defined by:

$$\theta_M = \arctan[(4\tan^2\beta+3)^{1/2} = 2\tan\beta]$$

where, $\theta_M$ is the angle of emission of said first stream of particles leaving the first source, and $\beta$ is the angle of tilt of said substrate;

(g) depositing a uniform coating on said substrate by exposing said tilted substrate to said intersected stream of first and second particles.

2. A method of depositing a thin film of uniform thickness on a solid substrate as defined in claim 1, wherein the particles in said first stream are atoms.

3. A method of depositing a thin film of uniform thickness on a solid substrate as defined in claim 2, wherein the particles in said second stream are ions.

4. A method of depositing a thin film of uniform thickness on a solid substrate as defined in claim 1 wherein the particles in said first stream are molecules.

5. A method of depositing a thin film of uniform thickness on a solid substrate as defined in claim 4, wherein the particles in said second stream are ions.

* * * * *